(12) United States Patent
Feilchenfeld et al.

(10) Patent No.: US 9,595,579 B2
(45) Date of Patent: Mar. 14, 2017

(54) DUAL SHALLOW TRENCH ISOLATION (STI) STRUCTURE FOR FIELD EFFECT TRANSISTOR (FET)

(71) Applicant: GLOBALFOUNDRIES INC., Grand Cayman (KY)

(72) Inventors: Natalie B. Feilchenfeld, Jericho, VT (US); Max G. Levy, Essex Junction, VT (US); Richard A. Phelps, Colchester, VT (US); Santosh Sharma, Essex Junction, VT (US); Yun Shi, South Burlington, VT (US); Michael J. Zierak, Colchester, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/712,397

(22) Filed: May 14, 2015

(65) Prior Publication Data
US 2015/0255539 A1    Sep. 10, 2015

Related U.S. Application Data

(62) Division of application No. 13/874,922, filed on May 1, 2013, now abandoned.

(51) Int. Cl.
*H01L 29/78* (2006.01)
*H01L 29/06* (2006.01)
(Continued)

(52) U.S. Cl.
CPC .... *H01L 29/0653* (2013.01); *H01L 21/76232* (2013.01); *H01L 29/1095* (2013.01);
(Continued)

(58) Field of Classification Search
CPC . H01L 21/76232; H01L 21/76; H01L 21/762; H01L 21/76218; H01L 21/76224;
(Continued)

(56) References Cited

U.S. PATENT DOCUMENTS

| 5,926,717 A | 7/1999 | Michael et al. |
| 6,180,466 B1 | 1/2001 | Ibok |

(Continued)

FOREIGN PATENT DOCUMENTS

| CN | 102005404 A | 4/2011 |
| CN | 102569159 A | 7/2012 |

(Continued)

OTHER PUBLICATIONS

Yushina, Office Action Communication for U.S. Appl. No. 13/874,922 dated Sep. 4, 2014, 23 pages.
(Continued)

*Primary Examiner* — Galina Yushina
(74) *Attorney, Agent, or Firm* — Michael LeStrange; Hoffman Warnick LLC (57) ABSTRACT

Various embodiments include structures for field effect transistors (FETs). In various embodiments, a structure for a FET includes: a deep n-type well; a shallow n-type well within the deep n-type well; and a shallow trench isolation (STI) region within the shallow n-type well, the STI region including: a first section having a first depth within the shallow n-type well as measured from an upper surface of the shallow n-type well, and a second section contacting and overlying the first section, the second section having a second depth within the shallow n-type well as measured from the upper surface of the shallow n-type well.

9 Claims, 8 Drawing Sheets

(51) Int. Cl.
*H01L 21/762* (2006.01)
*H01L 29/10* (2006.01)
*H01L 29/66* (2006.01)
*H01L 29/423* (2006.01)
*H01L 29/08* (2006.01)

(52) U.S. Cl.
CPC .... *H01L 29/66681* (2013.01); *H01L 29/7816* (2013.01); *H01L 29/7846* (2013.01); *H01L 29/0878* (2013.01); *H01L 29/42368* (2013.01)

(58) Field of Classification Search
CPC ..... H01L 21/76283; H01L 2027/11829; H01L 2027/11831; H01L 29/0653; H01L 29/1095; H01L 29/7816; H01L 29/42368; H01L 29/66681; H01L 29/0878; H01L 29/7846
See application file for complete search history.

(56) References Cited

U.S. PATENT DOCUMENTS

| | | | |
|---|---|---|---|
| 6,320,233 B1* | 11/2001 | Yamaguchi | H01L 27/092 257/368 |
| 7,504,339 B2 | 3/2009 | Chen et al. | |
| 7,892,929 B2 | 2/2011 | Chen et al. | |
| 7,898,008 B2 | 3/2011 | Fallica et al. | |
| 2002/0090795 A1 | 7/2002 | Ahn et al. | |
| 2005/0139951 A1* | 6/2005 | Pyi | H01L 21/76232 257/510 |
| 2008/0197451 A1 | 8/2008 | Mollat et al. | |
| 2008/0283915 A1* | 11/2008 | Jang | H01L 29/0653 257/344 |
| 2010/0032767 A1 | 2/2010 | Chapman et al. | |
| 2010/0184295 A1 | 7/2010 | Sato et al. | |
| 2013/0277742 A1* | 10/2013 | Lee | H01L 29/7816 257/343 |
| 2013/0334600 A1* | 12/2013 | Hsu | H01L 29/66681 257/337 |

FOREIGN PATENT DOCUMENTS

| | | |
|---|---|---|
| CN | 102637736 A | 8/2012 |
| KR | 100951463 | 4/2010 |

OTHER PUBLICATIONS

Yushina, Final Office Action Communication for U.S. Appl. No. 13/874,922 dated Feb. 4, 2015, 21 pages.

* cited by examiner

DUAL SHALLOW TRENCH ISOLATION (STI) STRUCTURE FOR FIELD EFFECT TRANSISTOR (FET)

FIELD

The subject matter disclosed herein relates to integrated circuit devices. More particularly, the subject matter relates to transistor structures in integrated circuit devices.

BACKGROUND

As integrated circuit technologies have advanced, the size of these devices has correspondingly decreased. In particular, as devices are reduced in scale to comply with ever-smaller packaging, tighter constraints are applied to their dimensions and spacings.

In some particular devices, such as high-voltage field effect transistors (HVFETs), smaller constraints can restrict the breakdown voltage and reliability of these devices. Further, these HVFETs can be harder to reliably design and manufacture on a smaller scale.

SUMMARY

Various embodiments include field effect transistor (FET) structures and methods of forming such structures. In various embodiments, a FET structure includes: a deep n-type well; a shallow n-type well and a p-type well each within the deep n-type well; and a shallow trench isolation (STI) region within the shallow n-type well, the STI region including: a first section having a first depth within the shallow n-type well as measured from an upper surface of the shallow n-type well; and a second section contacting and overlying the first section, the second section having a second depth within the shallow n-type well as measured from the upper surface of the shallow n-type well.

A first aspect includes a FET structure having: a deep n-type well; a shallow n-type well and a p-type well each within the deep n-type well; and a shallow trench isolation (STI) region within the shallow n-type well, the STI region including: a first section having a first depth within the shallow n-type well as measured from an upper surface of the shallow n-type well; and a second section contacting and overlying the first section, the second section having a second depth within the shallow n-type well as measured from the upper surface of the shallow n-type well.

A second aspect includes a method including: forming a shallow n-type well within a deep n-type well; and forming a dual-level shallow trench isolation (STI) within the shallow n-type well region, the dual-level STI including: a first section having a first depth within the n-type well as measured from an upper surface of the shallow n-type well; and a second section contacting and overlying the first section, the second section having a second depth within the shallow n-type well as measured from the upper surface of the shallow n-type well.

A third aspect includes a method including: forming a first trench in a doped substrate; forming a pad oxide over a bottom of the first trench, sidewalls of the first trench, and an upper surface of the doped substrate; forming a pad nitride over the pad oxide; forming a mask over the pad nitride to define a shallow trench isolation (STI) window; and etching the pad nitride, the pad oxide and the doped substrate to form a second trench below the first trench and connected with the first trench, the second trench having a distinct width from a width of the first trench.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted, the subject matter disclosed herein relates to integrated circuit devices. More particularly, the subject matter relates to transistor structures in integrated circuit devices.

Various particular embodiments include a FET structure having: a deep n-type well; a shallow n-type well and a p-type well each within the deep n-type well; and a shallow trench isolation (STI) region within the shallow n-type well, the STI region including: a first section having a first depth within the shallow n-type well as measured from an upper surface of the shallow n-type well; and a second section contacting and overlying the first section, the second section having a second depth within the shallow n-type well as measured from the upper surface of the shallow n-type well.

Various additional particular embodiments include a method including: forming a shallow n-type well within a deep n-type well; and forming a dual-level shallow trench isolation (STI) within the shallow n-type well, the dual-level STI including: a first section having a first depth within the shallow n-type well as measured from an upper surface of the shallow n-type well; and a second section contacting and overlying the first section, the second section having a second depth within the shallow n-type well as measured from the upper surface of the shallow n-type well.

Various further particular embodiments include a method including: forming a first trench in a doped substrate; forming a pad oxide over a bottom of the first trench, sidewalls of the first trench, and an upper surface of the doped substrate; forming a pad nitride over the pad oxide; forming a mask over the pad nitride to define a shallow trench isolation (STI) window; and etching the pad nitride, the pad oxide and the doped substrate to form a second trench below the first trench and connected with the first trench, the second trench having a distinct width from a width of the first trench.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely exemplary.

It is understood that commonly labeled elements between the figures can represent substantially identical components, unless otherwise noted. Redundant description of these elements is minimized herein for the purposes of clarity.

Figure 1:
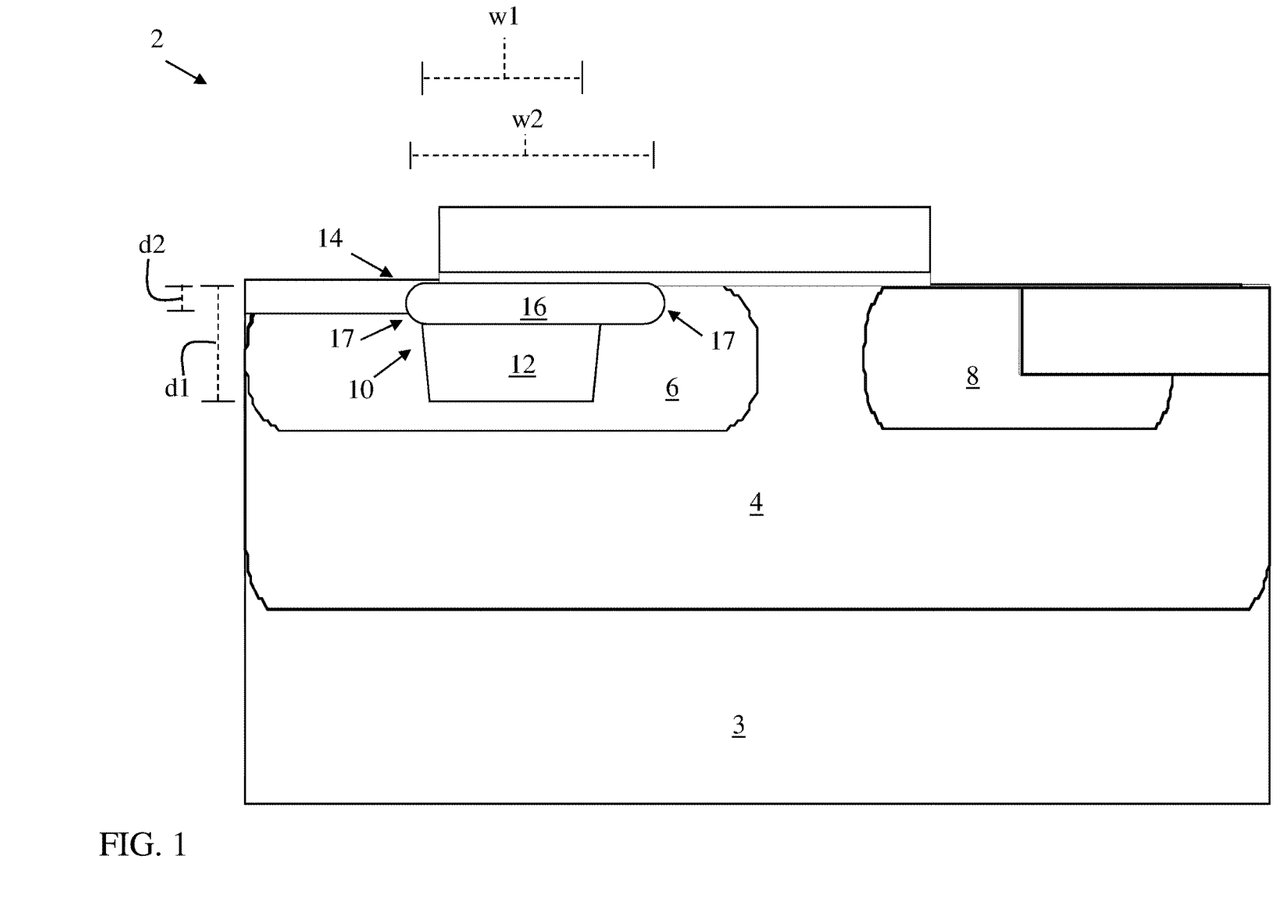
FIG. 1 shows a schematic cross-sectional depiction of a field effect transistor (FET) structure according to various embodiments.

Turning to FIG. 1, a schematic depiction of a field-effect transistor (FET) structure (e.g., a high-voltage FET, or HVFET) 2 is shown according to various embodiments. The FET structure 2 can include a deep n-type well 4, and a shallow n-type well 6 and a p-type well 8 each within the deep n-type well 4. The shallow n-type well 6 can include an n-type doped region within the deep n-type well 4; and the p-type well 8 can include a p-type doped region within the deep n-type well 4. In some embodiments, the deep n-type well 4 overlies a substrate 3, which can include silicon and/or other conventional substrate materials known in the art. In various embodiments, the deep n-type well 4 has a depth of approximately 4-8 microns, and in particular embodiments, the deep n-type well 4 has a depth of approximately 6 microns. In various embodiments, the shallow n-type well 6 has a depth of approximately 1-2 microns, and in particular embodiments, the shallow n-type well 6 has a depth of approximately 1.5 microns.

As shown in FIG. 1, the FET structure 2 can include a shallow trench isolation (STI) region 10 within the shallow n-type well 6. In various particular embodiments, the FET structure 2 includes a high-voltage complementary metal oxide semiconductor (HVCMOS) FET structure. As will be described herein, the STI region 10 can include a dual-level STI that provides various performance benefits when compared with conventional transistor structures.

In any case, the STI region 10 can include a first section 12 having a first depth (d1) within the shallow n-type well 6 as measured from an upper surface 14 of the shallow n-type well 6. The first section 12 can be formed of a conventional STI material, e.g., silicon oxide. The STI region 10 can also include a second section 16 contacting and overlying the first section 12. The second section can have a second depth (d2) within the n-type well as measured from the upper surface 14 of the shallow n-type well 6. That is, according to various embodiments, the FET structure 2 (as well as other FET structures shown and described herein) can include an STI region (e.g., STI region 10) that has two distinct sub-regions having distinct depths. The FET structure 2 can include a polysilicon gate layer 15, overlying the STI region 10 and extending from the p-type well to the n-type well.

In various embodiments, the second section 16 has a greater width (w2) than the first section 12 (w1), e.g., as shown in FIG. 1. The second section 16 can include a zero-level mask material, e.g., silicon oxide. In various embodiments, e.g., as shown in FIG. 1, the second section 16 can extend above the shallow n-type well 6. That is, a portion of the second section 16 can extend above the upper surface 14 of the n-type well 6. As shown in one example embodiment in FIG. 1, in some cases, the second section 16 extends laterally beyond the first section 12, e.g., while remaining laterally within the borders of the shallow n-type well 6. In the embodiment shown in FIG. 1, the second section 16 can include a substantially rounded profile proximate at least one lateral edge 17 thereof. Shown in FIG. 1, in some embodiments, the second section 16 can include a substantially rounded profile proximate two lateral edges 17 thereof.

Figure 2:
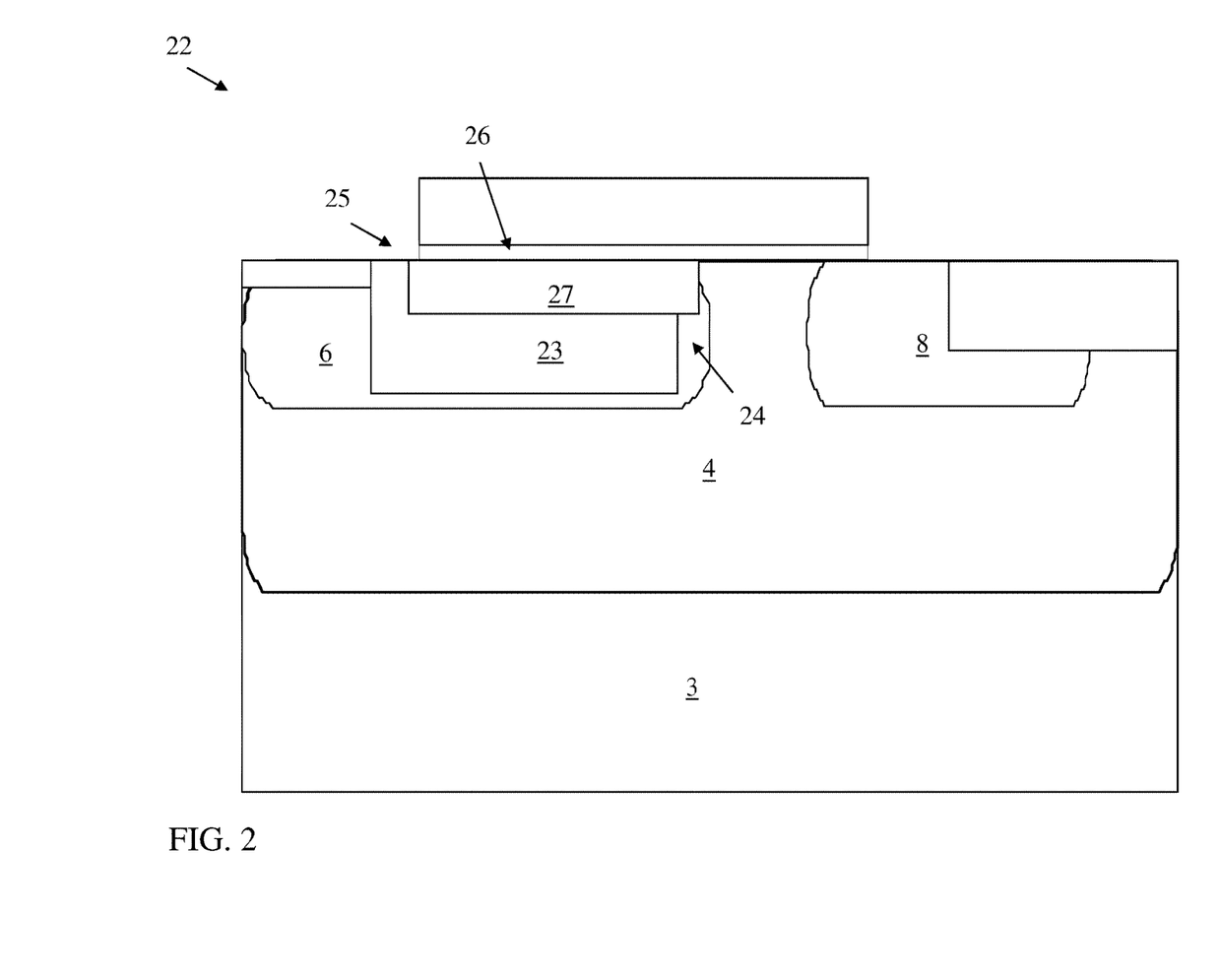
FIG. 2 shows a schematic cross-sectional depiction of a FET structure according to various additional embodiments.

In various other embodiments, for example, in the FET structure 22 shown in FIG. 2, a portion of a first section 23 (of an STI region 24) can include an upper surface 25 that is coplanar (sharing a same depth in the FET structure 22) with an upper surface 26 of a second section 27 of the STI region 24. In these embodiments, the second section 27 extends laterally beyond the first section 23 in only one direction, e.g., toward the p-type well 8.

Figure 3:
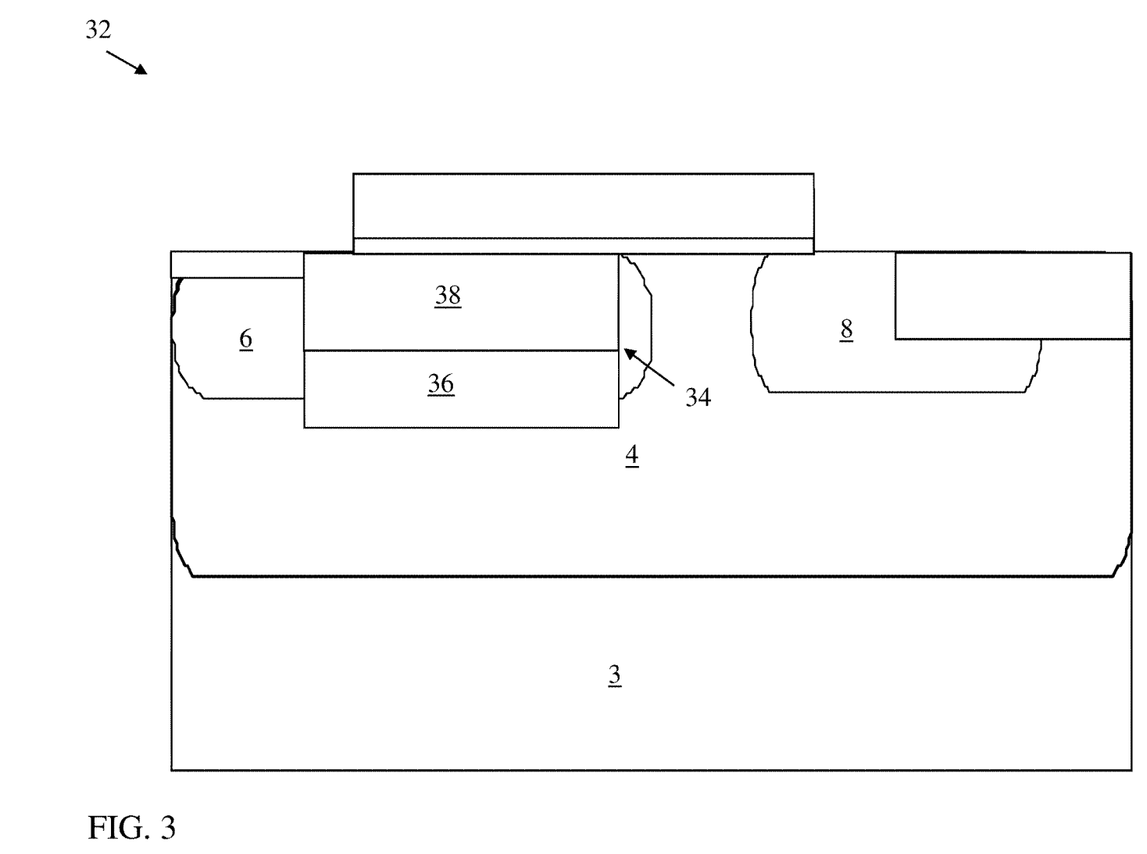
FIG. 3 shows a schematic cross-sectional depiction of a FET structure according to various additional embodiments.

FIG. 3 shows a schematic depiction of a FET structure 32 according to various additional embodiments. The FET structure 32 includes an STI region 34 having a first section 36 and a second section 38 overlying the first section 34. In these embodiments, the first section 36 and the second section 38 can have substantially equal widths, and can be substantially vertically aligned. In these particular embodiments, the first section 36 can extend below (to a greater depth) the shallow n-type well region 6, and can span between the deep n-type well 4 and the shallow n-type well region 6. In some cases, the first section 36 can include a zero-level mask material, e.g., as described with respect to FIG. 1. The second section 38 can include a conventional STI material, e.g., silicon oxide.

Figure 4:
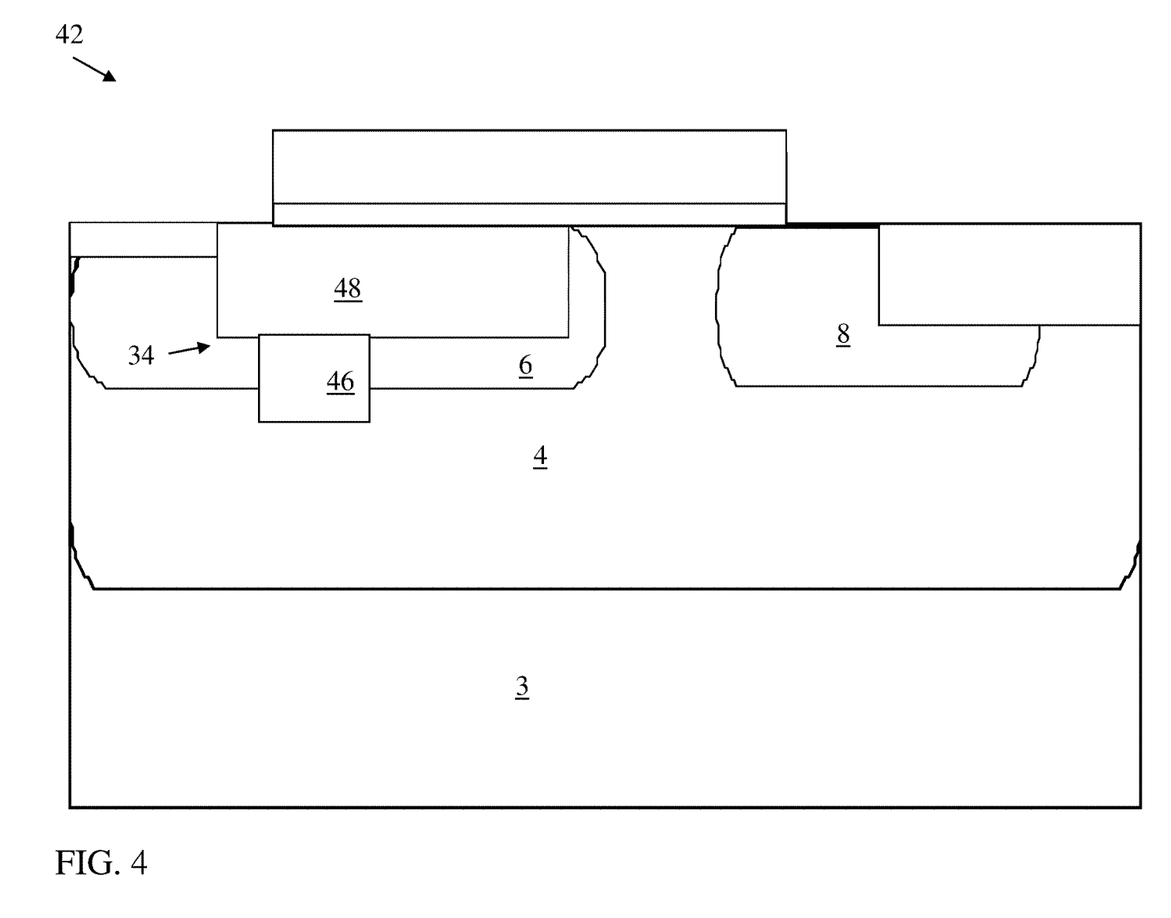
FIG. 4 shows a schematic cross-sectional depiction of a FET structure according to various additional embodiments.

FIG. 4 shows another embodiment of a FET structure 42, where an STI region 44 includes a first section 46 having a lesser width (w1) than a width (w2) of a second section 48. In some cases, the first section 46 can have a lateral width (w1) that is less than half the width (w2) of the second section 48. In various embodiments, the first section 46 can contact the second section 48 span through the shallow n-type well 6, and contact the deep n-type well 4. That is, the first section 46 spans between the deep n-type well 4 and the second section 48.

Figure 5:
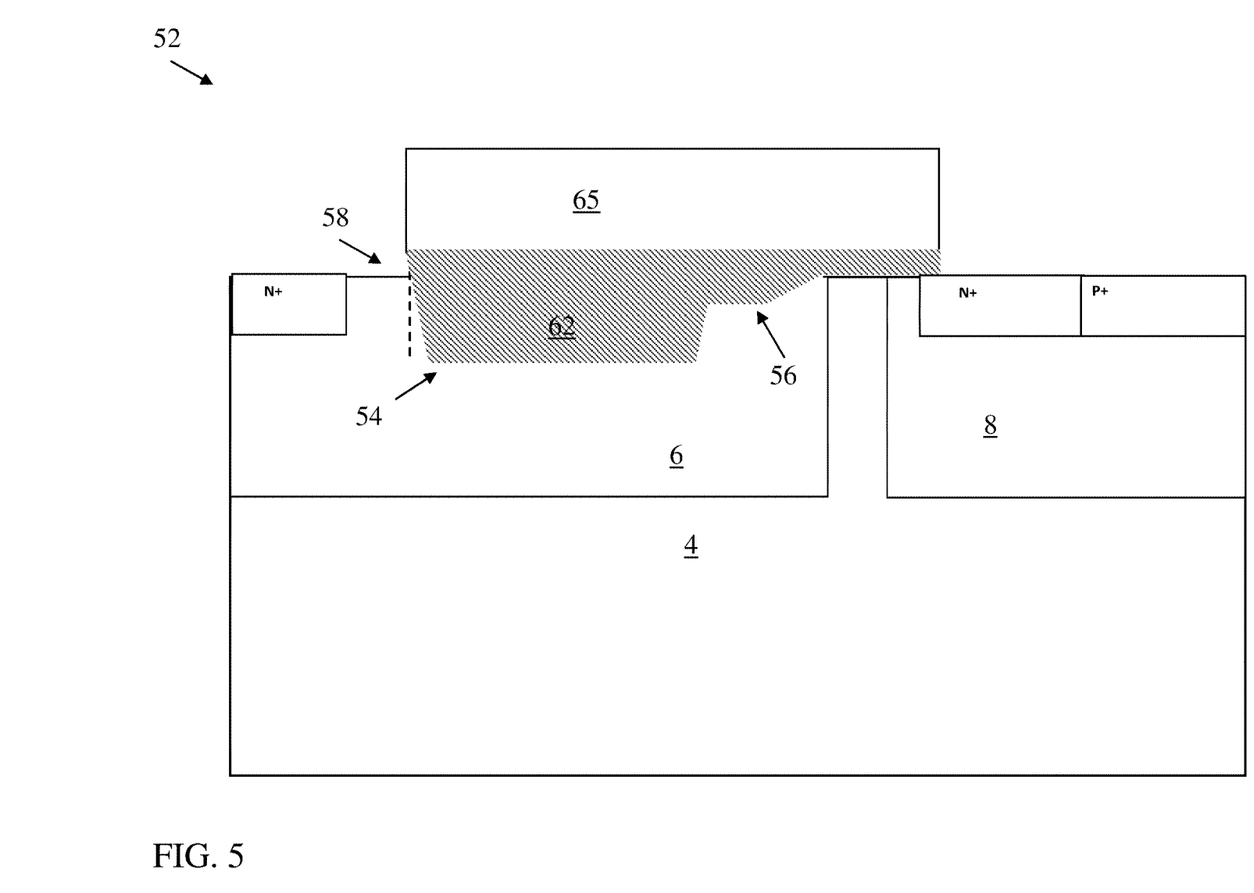
FIG. 5 shows a schematic cross-sectional depiction of a FET structure according to various additional embodiments.

FIG. 5 shows another embodiment of a FET structure 52, which includes a stepped STI region 54 formed of a substantially uniform STI material, e.g., silicon oxide. That is, the STI region 54 can include a rounded profile 56, which may be located proximate an upper surface 58 of a shallow n-type well 6. The rounded profile 56 can span between a gate dielectric material section, e.g., silicon oxide 60 above the upper surface 58 of the shallow n-type well 6 and an STI section 62 below the surface of the shallow n-type well 6. In the FET structure 52 of FIG. 5, a polysilicon layer 65 can be formed over the STI region 54, e.g., forming a cap over an upper surface of the FET structure 52.

Figure 6:
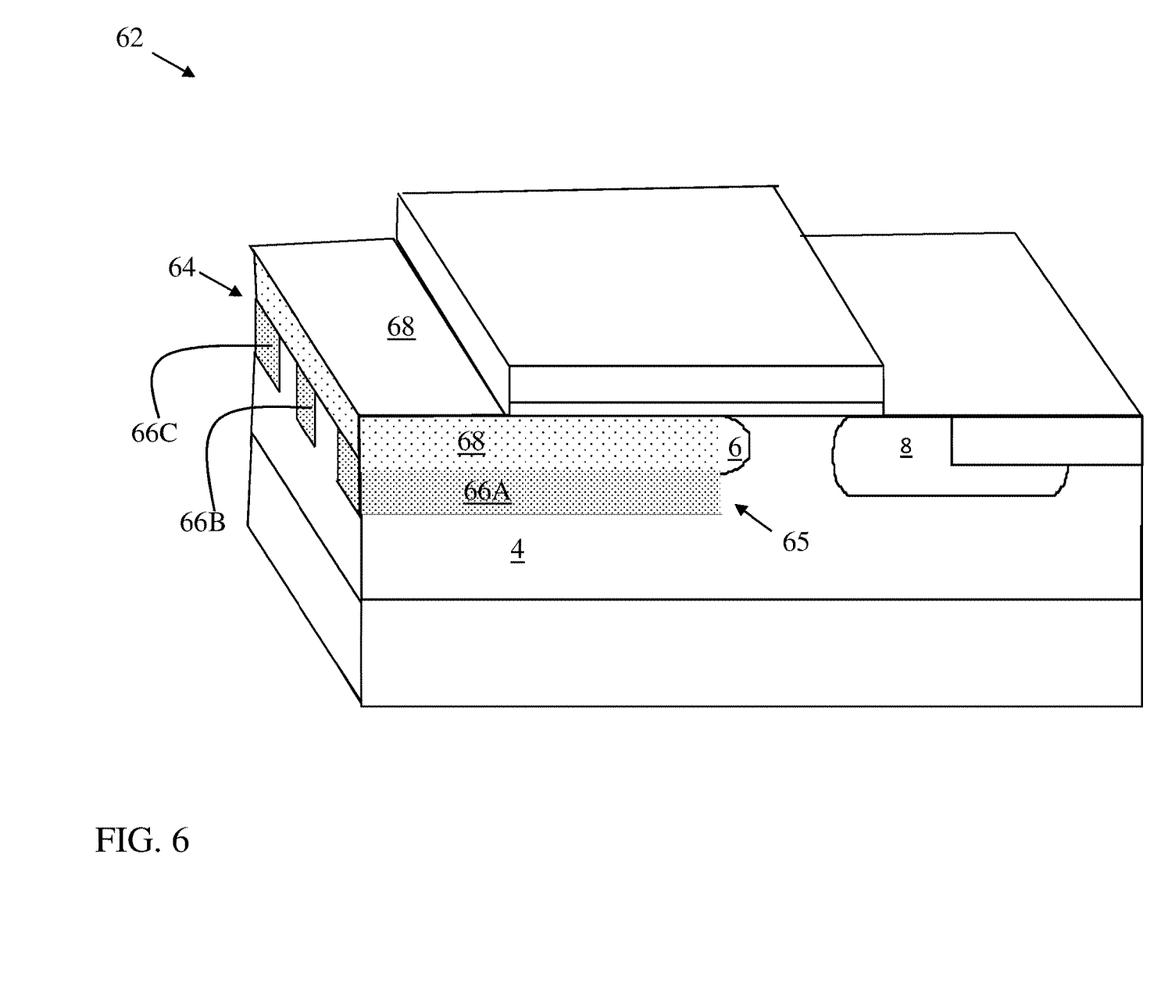
FIG. 6 shows a schematic three-dimensional perspective depiction of a FET structure according to various additional embodiments.

FIG. 6 shows a three-dimensional perspective view of another embodiment of a FET structure 62 according to various embodiments. As shown the FET structure 62 can include an STI region 64 having a first section 66, which can include a zero-level mask material, e.g., silicon oxide. As shown, the first section 66 can include distinct sections 66A, 66B, 66C, etc. separated by deep n-type well 4 within a layer of the FET structure 62. Overlying the first section 66 is a blanket layer second section 68, which covers the distinct sections 66A, 66B, 66C of the first section 66 as well as portions of the deep n-type well 4. The second section 68 of the STI region 64 can include any conventional STI material, e.g., silicon oxide.

FIGS. 7A-7D illustrate processes in forming a FET structure (e.g., FET structures shown and described herein) according to various embodiments.

Figure 7A:
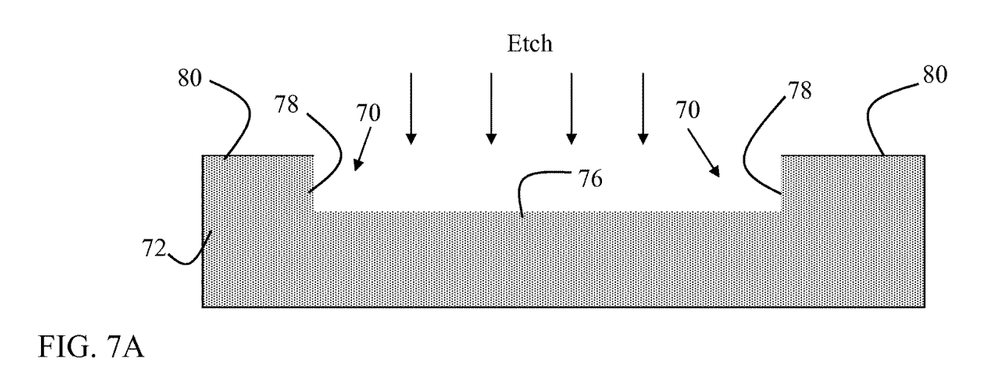
FIGS. 7A-7D show schematic depictions of precursor structures undergoing processes according to various embodiments.

FIG. 7A shows a first process of forming a FET structure, including forming a first trench 70 in a doped substrate 72. In some embodiments, the doped substrate 72 can include an n-type doped substrate such as an n-type doped silicon. In various embodiments, the forming of the first trench 70 includes etching the doped substrate 72 to a first depth.

Figure 7B:
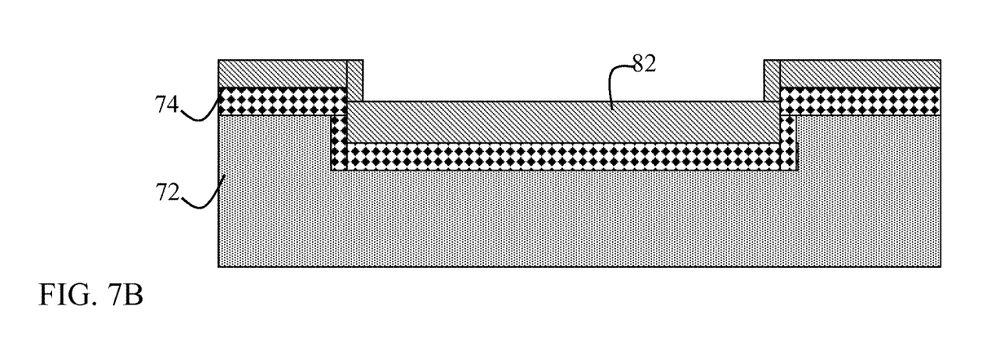
Figure 7C:
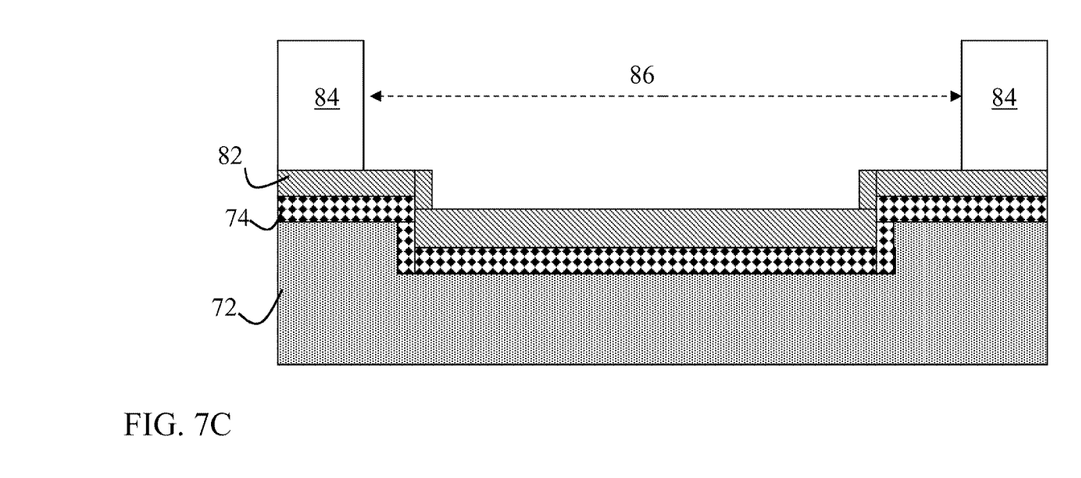

FIG. 7B shows an additional process of forming a pad oxide 74 over a bottom 76 (FIG. 7A) of the first trench 70, sidewalls 78 of the first trench 70, and an upper surface 80 of the doped substrate 72 (FIG. 7A). In various embodiments, the pad oxide 74 is deposited over the doped substrate 72 including the first trench 70. FIG. 7B also shows an additional process of forming a pad nitride 82 over the pad oxide 74. The pad nitride 82 can be formed to substantially cover the pad oxide 74, and in some cases, can be blanket deposited over the pad oxide 74. In various embodiments, the pad nitride 82 is deposited to cover the pad oxide 74 that is over the bottom of the first trench, sidewalls of the first trench and the upper surface of the doped substrate FIG. 7C shows an additional process of forming a mask 84 over the pad nitride 82 to define a shallow trench isolation (STI) window 86. The mask 84 can be initially deposited to substantially cover the pad nitride 82, and can be exposed to remove portions of the mask to define the STI window 86. In these cases, the mask 84 can include a photomask material.

Figure 7D:
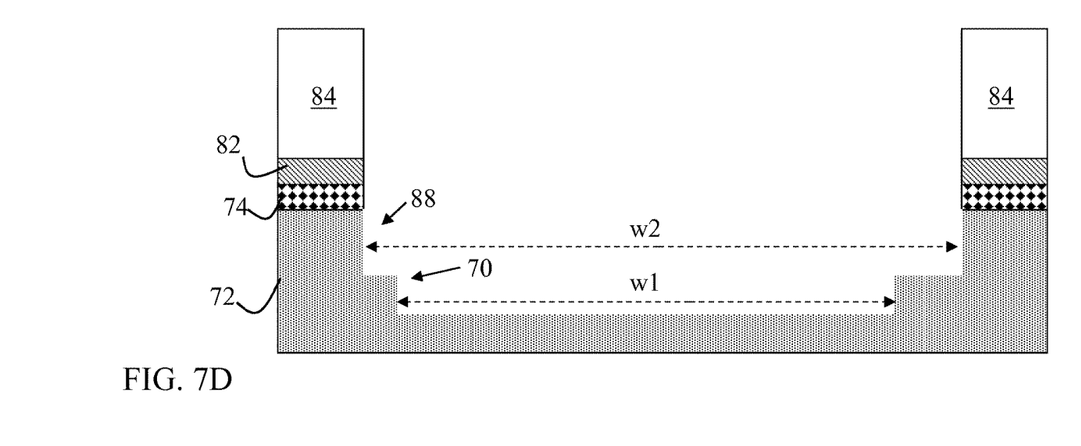

FIG. 7D shows an additional process of etching the pad nitride 82, the pad oxide 74 and the doped substrate 72 to form a second trench 88 above the first trench 70 and connected with the first trench 70. The second trench 88 can have a distinct width (w2) from a width (w1) the first trench 70. As shown in FIG. 7B, in some cases, the STI window 86 can have a substantially equal width (w2) as the second trench 88.

In various embodiments, the first trench 70 and the second trench 88 collectively form a stepped surface 90. The stepped surface 90 can later form the foundation of a stepped STI, as described herein. Further, as described herein, the stepped surface 90 can be rounded, beveled or otherwise at least partially arced in order to form one or more of the STI structures shown and described herein.

In various other embodiments, a method of forming a FET structure can include:

Process PA: forming a shallow n-type well within a deep n-type well; and

Process PB: forming a dual-level shallow trench isolation (STI) within the shallow n-type well region. In some embodiments, the dual-level STI can include: a) a first section having a first depth within the shallow n-type well as measured from an upper surface of the shallow n-type well; and b) a second section contacting and overlying the first section. The second section can have a second depth within the shallow n-type well as measured from the upper surface of the shallow n-type well.

In various embodiments, the process of forming of the dual-level STI within the shallow n-type well region includes:

(i) etching the shallow n-type well within the deep n-type layer to form a first trench having a first width;

(ii) forming a pad oxide over the shallow n-type well including the first trench; and (iii) forming a pad nitride over the pad oxide.

In some cases, the process of forming the dual-level STI further includes:

(iv) forming a mask over the pad nitride; and (v) etching the pad nitride, the pad oxide, and the shallow n-type well within the deep n-type well to form a second trench above the first trench. As described herein, the second trench can have a second width distinct from the first width.

In some cases, the process of forming the pad oxide (ii) includes forming the pad oxide over a bottom of the first trench, sidewalls of the first trench, and an upper surface of the shallow n-type well.

In some cases, the process of forming the pad nitride (iii) includes forming the pad oxide to substantially cover the pad oxide.

As used herein, the term "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. It is further understood that the terms "front" and "back" are not intended to be limiting and are intended to be interchangeable where appropriate.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

We claim:

1. A structure for a filed effect transistor (FET) comprising:
   a deep n-type well in a substrate;
   a shallow n-type well within the deep n-type well; and
   a shallow trench isolation (STI) region at least partially within the shallow n-type well, the STI region including:
   a plurality of first sections within the deep n-type well, each of the plurality of first sections being laterally separated from an adjacent first section by a respective portion of the deep n-type well, and
   a second section within the shallow n-type well and contacting each of the plurality of first sections, wherein the second section overlies and extends laterally beyond each of the plurality of first sections, wherein the second section includes a lower surface contacting and overlying the deep n-type well, and
   a gate region disposed directly over portions of all the plurality of the first sections.

2. The structure of claim 1, wherein the second section of the STI region includes silicon oxide.

3. The structure of claim 1, wherein a lateral width of the second section is greater than a combined lateral width of the plurality of first sections.

4. The structure of claim 1, wherein the second section of the STI region includes a portion contacting and overlying the shallow n-type well.

5. The structure of claim 1, wherein the second section of the STI region includes a portion extending laterally beyond each of the first sections within the shallow n-type well.

6. The structure of claim 1, further comprising:
   the gate region overlying and contacting the second section of the STI region.

7. The structure of claim 6, further comprising:
   a p-type well within the deep n-type well, wherein the gate region contacts and overlies the shallow n-type well and the p-type well.

8. A structure for a field effect transistor (FET), comprising:
   a deep n-type well in a substrate;
   a shallow n-type well within the deep n-type well, and
   a multi-layer shallow trench isolation (STI) region within the shallow n-type well and deep n-type well, the multi-layer STI region including:
   a plurality of first sections positioned within the deep n-type well, wherein a lower surface of each of the plurality of first sections is buried within the deep n-type well, each of the plurality of the first sections being laterally separated from an adjacent first section by a respective portion of the deep n-type well, and
   a blanket layer second section contacting and overlaying the plurality of the first sections, wherein an upper surface of the blanket layer second section is substantially coplanar with an upper surface of the shallow n-type well, and wherein a lower surface of the blanket layer second section is substantially coplanar with an upper surface of the deep n-type well.

9. The FET structure of claim 8, wherein the first section includes silicon oxide.

* * * * *